(12) United States Patent
Inaba et al.

(10) Patent No.: US 10,468,328 B2
(45) Date of Patent: Nov. 5, 2019

(54) SEMICONDUCTOR DEVICE AND METHOD OF MANUFACTURING A SEMICONDUCTOR DEVICE

(71) Applicant: FUJI ELECTRIC CO., LTD., Kawasaki (JP)

(72) Inventors: Yuki Inaba, Matsumoto (JP); Taiki Satou, Azumino (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/114,980

(22) Filed: Aug. 28, 2018

(65) Prior Publication Data
US 2019/0122953 A1 Apr. 25, 2019

(30) Foreign Application Priority Data

Oct. 25, 2017 (JP) .................. 2017-206689

(51) Int. Cl.
| | | |
|---|---|---|
| *H01L 23/31* | (2006.01) | |
| *H01L 23/373* | (2006.01) | |
| *H01L 21/56* | (2006.01) | |
| *H01L 23/04* | (2006.01) | |
| *H01L 23/492* | (2006.01) | |
| *H01L 25/07* | (2006.01) | |

(Continued)

(52) U.S. Cl.
CPC .......... *H01L 23/3735* (2013.01); *H01L 21/56* (2013.01); *H01L 21/565* (2013.01); *H01L 23/04* (2013.01); *H01L 23/3121* (2013.01); *H01L 23/3142* (2013.01); *H01L 23/492* (2013.01); *H01L 25/072* (2013.01); *H01L 25/18* (2013.01); *H01L 23/293* (2013.01); *H01L 2224/04026* (2013.01); *H01L 2224/04042* (2013.01); *H01L 2224/06181* (2013.01); *H01L 2224/291* (2013.01); *H01L 2224/29139* (2013.01); *H01L 2224/29147* (2013.01); *H01L 2224/32225* (2013.01); *H01L 2224/40227* (2013.01); *H01L 2224/48091* (2013.01); *H01L 2224/48227* (2013.01); *H01L 2224/73265* (2013.01); *H01L 2224/8384* (2013.01); *H01L 2224/83851* (2013.01)

(58) Field of Classification Search
None
See application file for complete search history.

(56) References Cited

U.S. PATENT DOCUMENTS

| | | | | |
|---|---|---|---|---|
| 6,519,844 B1* | 2/2003 | Nagarajan | ............... | H01L 23/13 257/711 |
| 2006/0061971 A1* | 3/2006 | Inoue | ............... | H01L 23/04 361/718 |

FOREIGN PATENT DOCUMENTS

| | | |
|---|---|---|
| JP | 7-171862 A | 7/1995 |
| JP | 2010-267850 A | 11/2010 |

* cited by examiner

*Primary Examiner* — Cheung Lee (57) ABSTRACT

A semiconductor device includes a conductive plate having a front surface on which a semiconductor element is mounted and a sealing resin sealing therein at least the front surface of the conductive plate. The conductive plate includes a structure that traps bubbles in a region where flows of the injected sealing resin merge. The conductive plate has a rectangular shape. The sealing resin is injected from a single inlet on a first longitudinal side of the conductive plate. The region where the flows of the sealing resin merge is a region of a corner of a second longitudinal side that across the semiconductor element, opposes the first longitudinal side from which the sealing resin is injected.

17 Claims, 6 Drawing Sheets

(51) Int. Cl.
*H01L 25/18* (2006.01)
*H01L 23/29* (2006.01)

SEMICONDUCTOR DEVICE AND METHOD OF MANUFACTURING A SEMICONDUCTOR DEVICE

CROSS REFERENCE TO RELATED APPLICATIONS

This application is based upon and claims the benefit of priority of the prior Japanese Patent Application No. 2017-206689, filed on Oct. 25, 2017, the entire contents of which are incorporated herein by reference.

BACKGROUND

1. Field

Embodiments of the invention relate to a semiconductor device and a method of manufacturing a semiconductor device.

2. Description of Related Art

Recently, with a focus on insulated gate bipolar transistors (IGBTs), power semiconductor modules are widely used in power converting equipment. A power semiconductor module is a power semiconductor device that has one or more built-in power semiconductor chips and that constitutes entirely or a part of a conversion connection.

Figure 9:
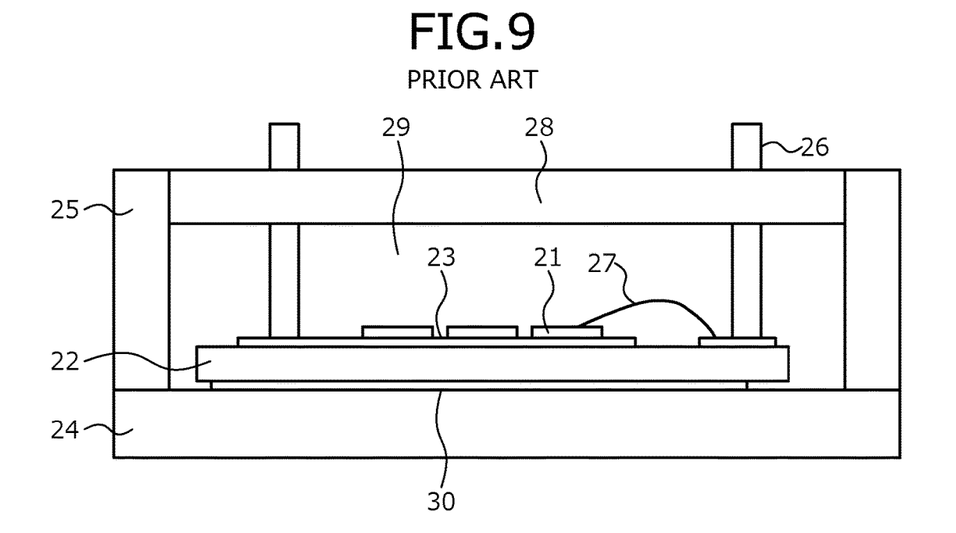
FIG. 9 is a cross-sectional view of a configuration of a conventional power semiconductor module.

FIG. 9 is a cross-sectional view of a configuration of a conventional power semiconductor module. As depicted in FIG. 9, a power semiconductor module includes a power semiconductor chip 21, an insulating substrate 22, a conductive plate 23, a heat dissipating plate 30, a metal substrate 24, a terminal case 25, a metal terminal 26, a metal wire 27, a cover 28, and a sealing resin 29. The power semiconductor chip 21 is a power semiconductor chip such as an IGBT or a diode and is mounted on the conductive plate 23. When the conductive plate 23 made of, for example, copper is provided on a front surface of the insulating substrate 22, which is a ceramic substrate or the like, and the heat dissipating plate 30 made of, for example, copper is provided on a rear surface, this is referred to as a stacked substrate. This stacked substrate 22 is soldered to the metal substrate 24. The terminal case 25 is adhered to the metal substrate 24. The terminal case 25 is insert molded by a thermoplastic resin such as polyphenylene sulfide (PPS) to fix the metal terminal 26 that leads signals out. The metal terminal 26 is soldered on the stacked substrate, penetrates the cover 28 and protrudes externally. The metal wire 27 is electrically connected to the power semiconductor chip 21 and the metal terminal 26. The cover 28 is made of a same thermoplastic resin as that of the terminal case 25. The sealing resin 29 fills the terminal case 25 as a sealing material that insulates and protects a surface of the stacked substrate 22 and the power semiconductor chip 21 on the substrate.

As the sealing resin 29, usually, a silicon resin or an epoxy resin is used. A silicon resin or an epoxy resin has dimensional stability, water resistance/chemical resistance and electrical insulating properties suitable as a sealing resin.

Semiconductor modules are becoming thinner, smaller, and having increasingly greater current capacities. Therefore, molded-types of semiconductor modules that omit the terminal case, the metal substrate, and the cover are being studied. A molded-type semiconductor module is molded using a sealing resin, in a mold containing a substrate on which a power semiconductor chip provided.

With a molded-type semiconductor module, an occurrence of voids (bubbles) at the time of filling with the sealing resin 29 is problematic. For example, a known semiconductor device has a structure that includes an air vent for discharging outside the semiconductor device, air in a cavity, and in an inner surface of each cavity, has a microgroove that is connected to the air vent and that is of a size that prevents resin from entering, for example, refer to Japanese Laid-Open Patent Publication No. H7-171862. Another known semiconductor device has a recess to capture residual air accompanying a resin sealing process formed to communicate with a groove of a die pad. The recess is provided at a position at which even when a void occurs, product quality is not adversely affected, for example, refer to Japanese Laid-Open Patent Publication No. 2010-267850.

SUMMARY

According to an embodiment, a semiconductor device includes a conductive plate having a front surface and a semiconductor element mounted on the front surface; and a sealing resin sealing therein at least the front surface of the conductive plate. A structure that traps bubbles is provided on the front surface of the conductive plate, in a region where flows of the sealing resin merge.

In the embodiment, the conductive plate has a rectangular shape. The sealing resin is injected from a single inlet on a first longitudinal side of the conductive plate. The region in which the flows of the sealing resin merge is a region of a corner of a second longitudinal side that across the semiconductor element, opposes the first longitudinal side from which the sealing resin is injected.

In the embodiment, the conductive plate has a rectangular shape. The sealing resin is injected from a plurality of inlets on a first longitudinal side of the conductive plate. The region in which the flows of the sealing resin merge is provided at a center of a second longitudinal side that opposes the first longitudinal side from which the sealing resin is injected.

In the embodiment, the conductive plate has a rectangular shape. The sealing resin is injected from an inlet on a first transverse side of the conductive plate. The region in which the flows of the sealing resin merge is provided at a center of a second transverse side that opposes the first transverse side from which the sealing resin is injected.

In the embodiment, the structure that traps bubbles is provided orthogonal to a direction of a vector of the flows of the sealing resin.

In the embodiment, the structure that traps the bubbles has a shape of a groove or a hole.

In the embodiment, the semiconductor device further includes a stacked substrate having the conductive plate on which the semiconductor element is mounted on the front surface, an insulating substrate, and a heat dissipating plate. The sealing resin seals therein the semiconductor element, the conductive plate, and the insulating substrate, and exposes a rear surface of the heat dissipating plate.

In the embodiment, the semiconductor device further includes a thin conductive plate between the conductive plate and the insulating substrate. The thin conductive plate is free of the structure that traps the bubbles.

According to an embodiment of the present invention, a method of manufacturing a semiconductor device, includes forming on a front surface of a conductive plate, in a region where flows of a sealing resin merge, a structure that traps bubbles; mounting a semiconductor element on the front surface of the conductive plate; and injecting the sealing resin and sealing therein, the semiconductor element and the front surface of the conductive plate.

Objects, features, and advantages of the present invention are specifically set forth in or will become apparent from the following detailed description of the invention when read in conjunction with the accompanying drawings.

DESCRIPTION OF EMBODIMENTS

First, problems associated with the above technologies will be discussed. Due to voids (bubbles) remaining at a front surface of the conductive plate on which the power semiconductor chip is mounted, the sealing resin may peel near the power semiconductor chip, whereby insulation of the power semiconductor chip may become defective and reliability of the power semiconductor module may decrease. In particular, with a semiconductor module in which plural power semiconductor chips are mounted, resin flow at the time of resin injection is complex and voids may remain at the front surface of the conductive plate and the reliability of the power semiconductor module may decrease.

Embodiments of a semiconductor device and a method of manufacturing a semiconductor device according to the present invention will be described in detail with reference to the accompanying drawings. The inventors, as a result of intensive research, found that when forming a groove (air pocket) for trapping voids, by providing the groove in a region where flows of the encapsulated sealing resin merge, insulation defects due to peeling of the sealing resin on the conductive plate could be prevented.

Figure 1:
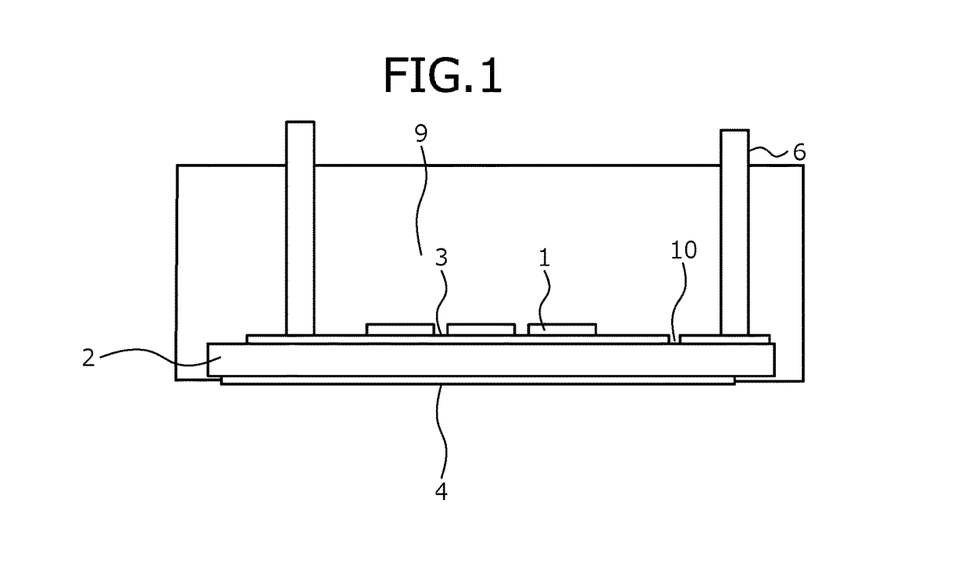
FIG. 1 is a cross-sectional view of a power semiconductor module according to a first embodiment.

FIG. 1 is a cross-sectional view of the power semiconductor module according to a first embodiment. In power semiconductor module, an insulating substrate 2 has on one surface that is a front surface, a conductive plate 3 containing copper or the like and has on the other surface that is a rear surface, a heat dissipating plate 4 containing copper or the like, constituting a stacked substrate. On a front surface of the conductive plate 3 of the stacked substrate, through a non-depicted conductive bonding layer, power semiconductor chips 1 are mounted. Further, on front surfaces of the power semiconductor chips 1, a non-depicted metal wire is provided. In place of the metal wire, a metal terminal may be connected through the non-depicted conductive bonding layer. Further, by the non-depicted conductive bonding layer, an implant method printed circuit board having a metal terminal (implant pin) may be mounted. Alternatively, at the front surfaces of the power semiconductor chips 1, a lead frame may be mounted. The power semiconductor module has metal members such as the conductive plate 3, the metal terminal, the lead frame, etc. Surfaces of these members are covered by a sealing resin 9. Further, at the front surface of the conductive plate 3, an air pocket 10 for trapping voids is provided. A position, shape, size, and the like of the air pocket 10 will be described hereinafter.

The power semiconductor chips 1 are made of a material such as silicon (Si), silicon carbide (SiC), gallium nitride (GaN), or the like. The power semiconductor chips 1 include switching elements such as an insulated gate bipolar transistor (IGBT), a power metal oxide semiconductor field effect transistor (MOSFET), etc. Here, the power semiconductor chips 1, for example, each has at a rear surface, a drain electrode or collector electrode as a main electrode, and has at a front surface, a gate electrode and a source electrode, or emitter electrode, as a main electrode.

Further, the power semiconductor chips 1, as necessary, include a diode such as a Schottky barrier diode (SBD), a free wheeling diode (FWD), etc. Here, the power semiconductor chips 1 each has at the rear surface, a cathode electrode as a main electrode, and has at the front surface, an anode electrode as a main electrode. In the power semiconductor chips 1, the electrode at the rear surface is bonded to the front surface of the predetermined conductive plate 3 by a non-depicted bonding material.

The stacked substrate includes the insulating substrate 2, the heat dissipating plate 4 formed on the rear surface of the insulating substrate 2, and the conductive plate 3 formed on the front surface of the insulating substrate 2. The insulating substrate 2 is made of a ceramic having high thermal conductivity and containing aluminum oxide, aluminum nitride, silicon nitride, etc. having excellent thermal conductive properties. The heat dissipating plate 4 is made of copper, aluminum, iron, or silver, which have excellent thermal conductive properties, or a metal such as an alloy containing at least one type thereof. The conductive plate 3 is made of copper or aluminum, which have excellent thermal conductive properties, or a metal such as an alloy containing at least one type thereof. As a stacked substrate having such a structure, for example, a direct copper bonding (DCB) substrate or an active metal blazed (AMB) substrate may be used. The stacked substrate is structured to conduct heat generated by the power semiconductor chips 1 to outside the semiconductor device, via the conductive plate 3, the insulating substrate 2, and the heat dissipating plate 4. Further, the stacked substrate may be a metal base substrate. The metal base substrate is constituted by an insulating layer made of resin on the heat dissipating plate 4 made of a metal such as aluminum and the conductive plate 3 stacked on the insulating layer.

The sealing resin 9 may be a thermosetting resin or a thermoplastic resin, and may contain an adhesion aid. Further, according to purpose, as an inorganic filler, for example, a microfiller or a nanofiller containing inorganic particles such as silica, alumina, boron nitride, aluminum nitride may be included.

The thermosetting resin may be an epoxy resin. As the epoxy resin, an epoxy resin having at least two epoxy groups in one molecule may be used and, for example, a bisphenol AD type, a bisphenol F type, a bisphenol A type resin obtained by introducing an allyl group, a phenol novolak type epoxy resin, a Cresol novolac type epoxy resin, a multi-functional epoxy resin, an alicyclic epoxy resin, a naphthalene type epoxy resin, may be given as example, however, the epoxy resin is not limited hereto. The epoxy resin may be used alone or as a mixture of two or more types. When a mixture is used and a total mass of the epoxy resin is 100 parts by mass, 50 parts by mass or more of a bisphenol A type may be included. When molding is by transfer molding using a thermosetting resin, a mold temperature may be 120 to 200 degrees C., a range at which epoxy resin liquefies.

The thermoplastic resin may be a polyphenylene sulfide (PPS) resin or a polybutylene terephtalate (PBT) resin. When molding is by injection molding using the thermoplastic resin, a cylinder temperature may be 250 to 350 degrees C. and a mold temperature may be 100 to 200 degrees C.

The adhesion aid, a chelating agent, may be any one of or a mixture of two or more of an aluminum-based chelating agent, a titanium-based chelating agent, and a zirconium-based chelating agent. Further, the sealing resin 9, according to purpose, may include a curing agent. As the curing agent, an amine-based curing agent, for example, aliphatic diamine, aliphatic polyamine, aromatic amine, cyclic amine, an imidazole-based curing agent, an acid anhydride-based curing agent, for example, aliphatic acid anhydride, alicyclic acid anhydride, aromatic acid anhydride, a polymercaptan-based curing agent, for example, liquid polymercaptan, a polysulfide resin, etc. may be used alone or as a mixture of two or more, however, the curing agent is not limited hereto.

The bonding material may be solder, a conductive adhesive, a sintered metal such as nanoparticles of silver (Ag), copper (Cu), etc.

Figure 2:
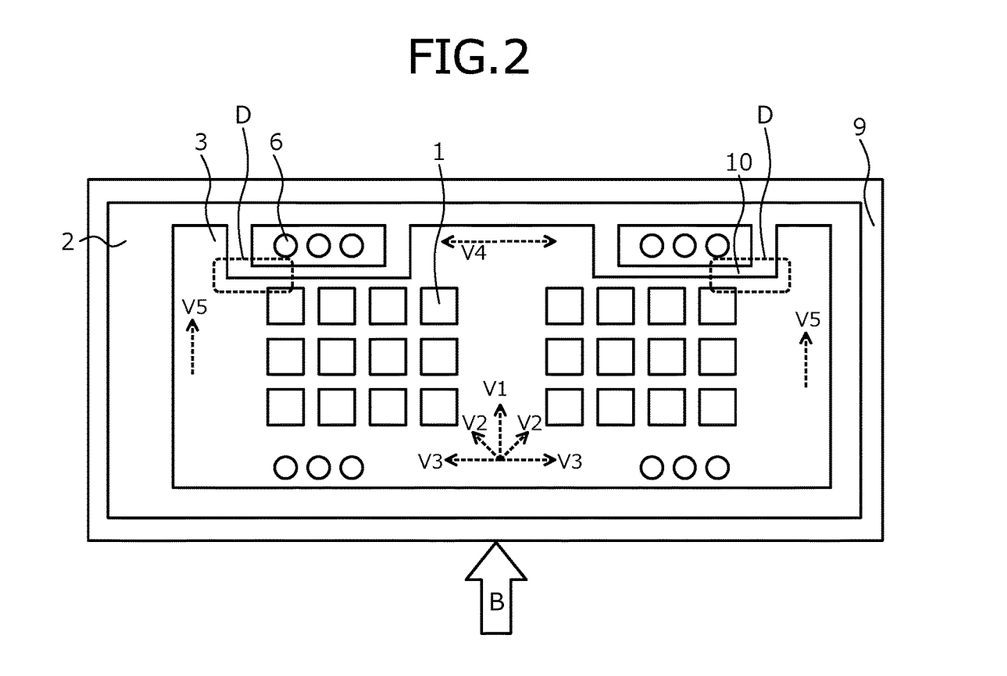
FIG. 2 is a top view of a structure of the power semiconductor module according to the first embodiment.

FIG. 2 is a top view of a structure of the power semiconductor module according to the first embodiment. FIG. 2 is a top view of the insulating substrate 2 of the power semiconductor module in FIG. 1 as viewed from an upper side, i.e., a side having a cover 8. As depicted in FIG. 2, the sealing resin 9 is injected in a cavity of a mold from a longitudinal side of the stacked substrate that has a rectangular shape, i.e., a direction indicated by reference character B.

As depicted in FIG. 2, the injected sealing resin 9 spreads in the cavity of the mold radially as indicated by arrows V1, V2, V3 as viewed from a top of the stacked substrate. At this time, the sealing resin 9 flowing as indicated by arrow V1 hits a longitudinal side that faces toward an inlet of the cavity of the mold and the sealing resin 9 spreads along the longitudinal side in a direction indicated by arrow V4. Similarly, the sealing resin 9 flowing as indicated by arrow V3 hits a transverse side of the cavity of the mold and spreads along the transverse side in a direction indicated by arrow V5. Further, the sealing resin 9 flowing as indicated by arrow V2 spreads on the power semiconductor chips 1.

These flows of the sealing resin 9 merge in a region D of a corner of the cavity of the mold, i.e., the region D of a corner on the side opposite from the side where the sealing resin 9 is injected, across the power semiconductor chips 1. In the present embodiment, the air pocket 10 is provided in the region D where the flows of the sealing resin 9 merge. Voids may be trapped by the air pocket 10. Voids are bodies of air (bubbles) occurring in the sealing resin 9.

The air pocket 10, for example, is a groove dug on the conductive plate 3 and the voids become caught in the groove, whereby the voids are trapped. To facilitate trapping of the voids, the air pocket 10 may be provided in a direction orthogonal to a direction of a vector of the flow of the sealing resin 9. For example, when the air pocket 10 is a groove, at the front surface (on the conductive plate 3) of the stacked substrate, the groove may be provided in a direction orthogonal to that indicated by arrow V5 or arrow V4. In this case, trapped voids stop and cease to flow. Further, voids may be prevented from concentrating at a single location as a result of trapped voids flowing and collecting at an edge of the air pocket 10 in cases such as when the air pocket 10 is provided parallel to the direction of the vector of flow.

The air pocket 10 is provided at a position separated from the power semiconductor chips 1, where degradation of electrical reliability of the power semiconductor module is not affected even when voids are trapped in the air pocket 10. Therefore, voids trapped in the air pocket 10 do not cause peeling of the sealing resin 9 at a periphery of the conductive plate 3 of the power semiconductor chips 1. Further, the trapped voids do not leave the air pocket 10 and therefore, do not move to a location where degradation of the electrical reliability of the power semiconductor module would be affected. As a result, the reliability of the power semiconductor module does not decrease due to insulation defects of the power semiconductor chips 1.

Further, when the insulating substrate 2 and the cavity of the mold has a rectangular shape and the sealing resin 9 is injected from a longitudinal side, the air pocket 10 is provided to be positioned in the region D of a corner on the opposite side, across the power semiconductor chips 1. Further, when the insulating substrate 2 and the cavity of the mold have a rectangular shape and the sealing resin 9 is injected from a transverse side of the rectangular shape, the flows of the sealing resin 9 merge near a center of the opposite side, across the power semiconductor chips 1, e.g., a region C depicted in FIG. 10, and therefore, the air pocket 10 may be provided here.

In general, the position at which the air pocket 10 is provided differs depending on the shapes of the insulating substrate 2 and the cavity of the mold and the injection position of the sealing resin 9. Therefore, regarding the position at which the air pocket 10 is provided, for example, a site where the flows of the sealing resin 9 merge may be obtained by resin flow simulation and the air pocket 10 may be provided at the site obtained. A site where the flows of the sealing resin 9 merge may be obtained by an actual experiment instead of by resin flow simulation.

Figure 3:
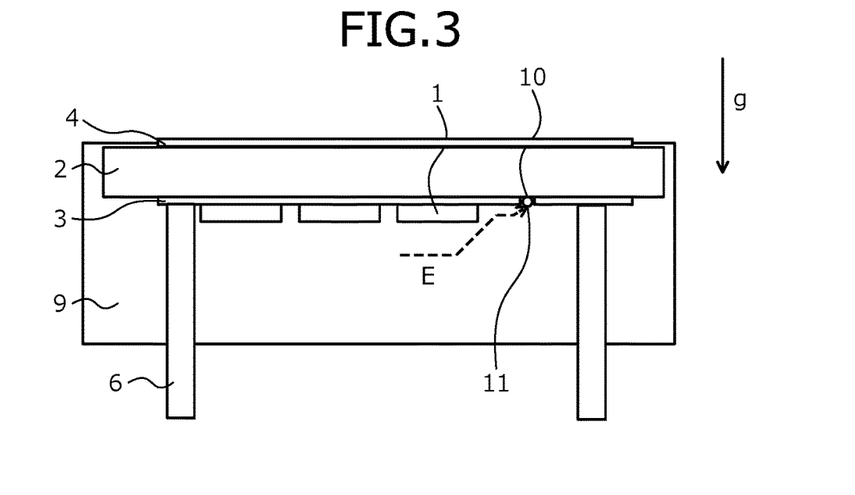
FIG. 3 is a cross-sectional view of trapping a void in the power semiconductor module according to the first embodiment.

Trapping of the voids by the air pocket 10 will be described. FIG. 3 is a cross-sectional view of trapping a void in the power semiconductor module according to the first embodiment. Injection of the sealing resin 9 in the cavity of the mold is performed in a state with a metal terminal 6 fixed to a bottom of the mold. In other words, when a force of gravity g is in a direction indicated by an arrow in FIG. 3, injection is performed in a state in which the stacked substrate is at a top and the power semiconductor chips 1 are beneath the conductive plate 3 of the stacked substrate.

In this state, when the sealing resin 9 is injected, a void 11 is lighter than the sealing resin 9 and therefore, as indicated by arrow E in FIG. 3, advances upward, i.e., a direction opposite that of the force of gravity g, and reaches the front surface of the conductive plate 3 on which the power semiconductor chips 1 are mounted. In the front surface of the conductive plate 3, a groove is provided as the air pocket 10, and the void 11 is sandwiched in the groove, becoming trapped therein. In this manner, provision of the groove in the conductive plate 3, enables trapping of the void 11.

Figure 4A:
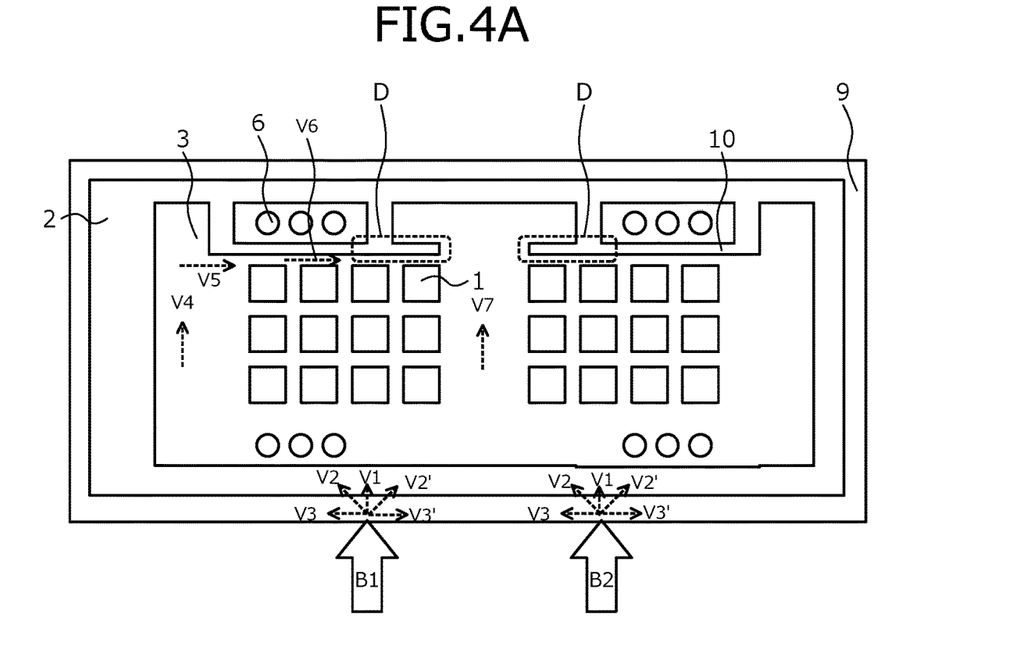
FIG. 4A is a top view depicting relationships of a resin inlet count and air pocket position in the first embodiment.
Figure 4B:
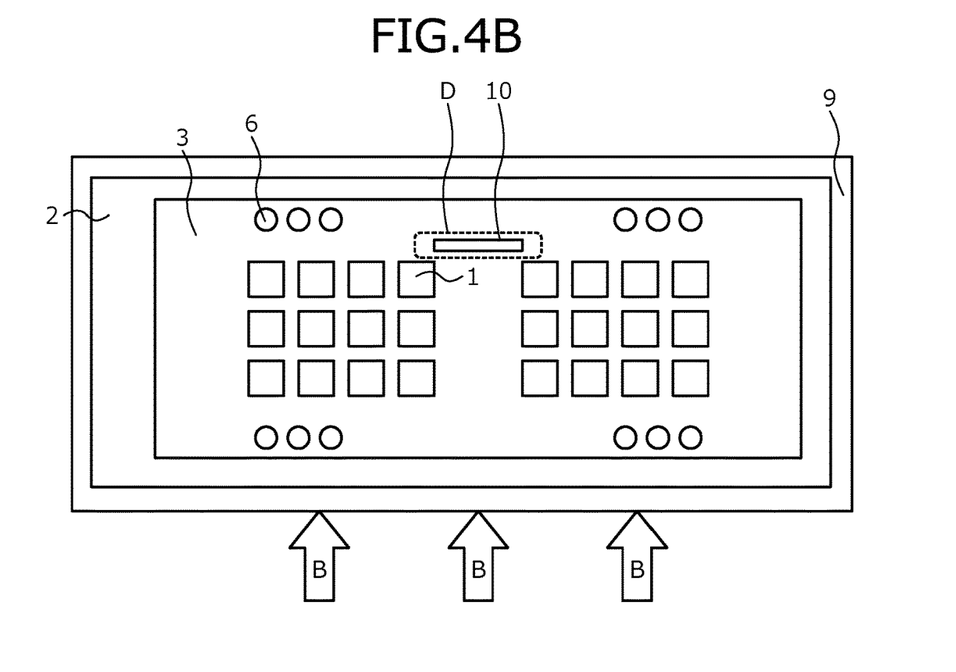
FIG. 4B is a top view depicting relationships of a resin inlet count and air pocket position in the first embodiment.
Figure 4C:
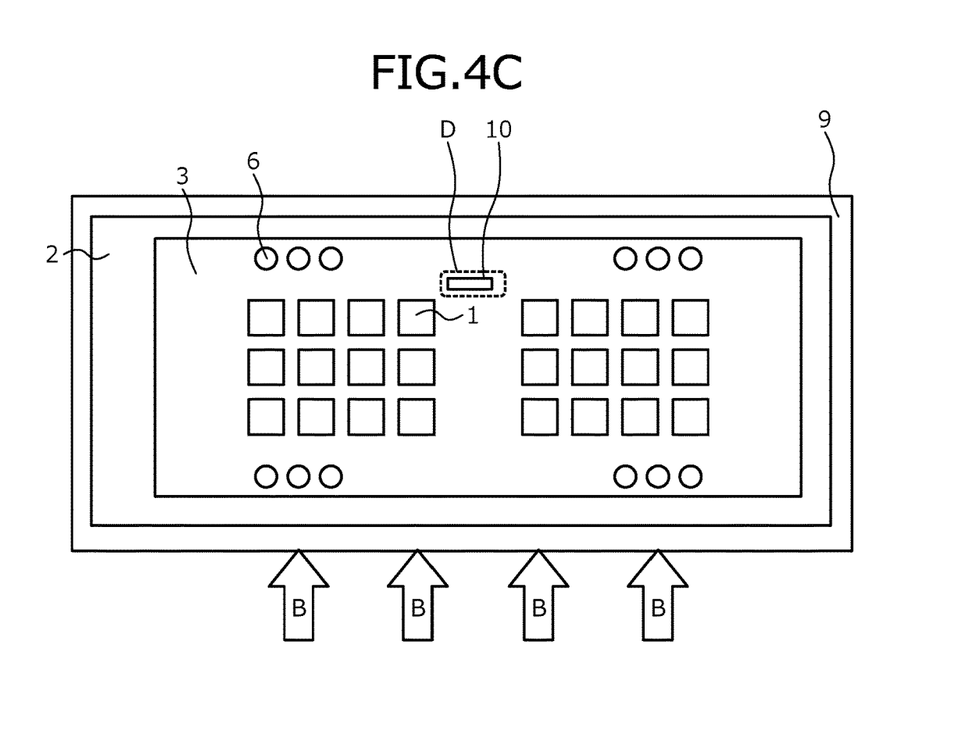
FIG. 4C is a top view depicting relationships of a resin inlet count and air pocket position in the first embodiment.

Further, a site where the flows of the sealing resin 9 merge differs depending on the number of injection positions of the sealing resin 9. Therefore, the position at which the air pocket 10 is provided may be changed based on the number of injection positions of the sealing resin 9. FIG. 1 depicts a case in which the number of injection positions of the sealing resin 9 is one. FIGS. 4A, 4B, and 4C are top views depicting relationships of a resin inlet count and air pocket position in the first embodiment.

Here, FIG. 4A depicts a case in which there are two injection positions of the sealing resin 9; FIG. 4B depicts a case in which there are three injection positions of the sealing resin 9; and FIG. 4C depicts a case in which there are four injection positions of the sealing resin 9. Further, each of these cases is an example of an instance when the sealing resin 9 is injected from a longitudinal side of the rectangular shape.

In the case depicted in FIG. 4A, similarly to the case depicted in FIG. 2, the injected sealing resin 9 spreads in the cavity of the mold radially as indicated by arrows V1, V2, V2', V3, V3'. A case in which the sealing resin 9 is injected from the injection position on the left-hand side and indicated by reference character B1 will be described. In this case, the injection position deviates from a center of a longitudinal side toward a transverse side. The sealing resin 9 flowing in the direction indicated by arrow V2 and the sealing resin 9 flowing in the direction indicated by arrow V3 hit the transverse side of the cavity of the mold, advance along the transverse side in the direction indicated by arrow V4 and subsequently, hit a longitudinal side of the cavity of the mold and spread along the longitudinal side, in the direction indicated by arrow V5. Further, the sealing resin 9 flowing in the direction indicated by arrow V1 hits the longitudinal side of the cavity of the mold. Here, the sealing resin 9 flowing in the direction indicated by arrow V2 and the sealing resin 9 flowing in the direction indicated by arrow V3 spread along the longitudinal side in the direction indicated by arrow V5 and so as to be pushed by this, spread along the longitudinal side in the direction indicated by arrow V6.

Further, the sealing resin 9 flowing in the direction indicated by arrow V3' hits the sealing resin 9 that is advancing in the direction indicated by arrow V3 from the injection position on the right-hand side and indicated by reference character B2, and advances in a direction toward a longitudinal side as indicted by arrow V7. The sealing resin 9 flowing in the direction indicated by arrow V2' hits the sealing resin 9 advancing in the direction indicated by arrow V2 from the injection position on the right-hand side and indicated by reference character B2, is pushed by the sealing resin 9 flowing in the direction indicated by arrow V3' and advances in the direction indicated by arrow V7 toward the longitudinal side. The sealing resin 9 that advances in the direction toward to the longitudinal side as indicated by arrow V7 hits the longitudinal side and spread in a direction opposite that indicated by arrow V6.

Thus, in a case of two injection positions like that depicted in FIG. 4A, flows advancing parallel to the transverse sides are numerous and therefore, the site where the flows of the sealing resin 9 merge is the region D near a center of the side opposite that from which the sealing resin 9 is injected. Therefore, by providing the air pocket 10 in the region D, voids may be trapped.

While detailed description of the flow of the sealing resin 9 is omitted, in the case of three injection positions of the sealing resin 9 depicted in FIG. 4B, similarly to the case depicted in FIG. 4A, the site where the flows of the sealing resin 9 merge is the region D near a center of the side opposite that from which the sealing resin 9 is injected. However, since there are further flows advancing parallel to the transverse sides, as depicted in FIG. 4B, the region D is closer to the center as compared to in the case depicted in FIG. 4A and a mathematical area of the region D is smaller. Therefore, similarly to the case depicted in FIG. 4A, by providing in the air pocket 10 the region D, voids may be trapped.

While detailed description of the flow of the sealing resin 9 is omitted, in the case of four injection positions of the sealing resin 9 depicted in FIG. 4C, similarly to the case depicted in FIG. 4A, the site where the flows of the sealing resin 9 merge is the region D near a center of the side opposite that from which the sealing resin 9 is injected. However, since the flows advancing parallel to the transverse sides are greater than in the case depicted in FIG. 4B, as depicted in FIG. 4C, the region D is closer to the center as compared to in the case depicted in FIG. 4B and the mathematical area of the region D is smaller. Therefore, similarly to the case depicted in FIG. 4B, the region in which the air pocket 10 is provided may be reduced. Even in this case, similarly to the cases depicted in FIGS. 4A and 4B, by providing the air pocket 10 in the region D, voids may be trapped.

Here, the air pocket 10, for example, may be provided as a groove of the conductive plate 3. Due to the air pocket 10, a volume of the conductive plate 3 decreases by that of the groove. The conductive plate 3 is provided to connect rear electrodes of the power semiconductor chips 1 and to dissipate heat of the power semiconductor chips 1, etc. When the volume of the conductive plate 3 is reduced, the resistance of the conductive plate 3 increases and heat dissipating capability decreases and therefore, the region in which the air pocket 10 is disposed may be reduced.

Figure 5:
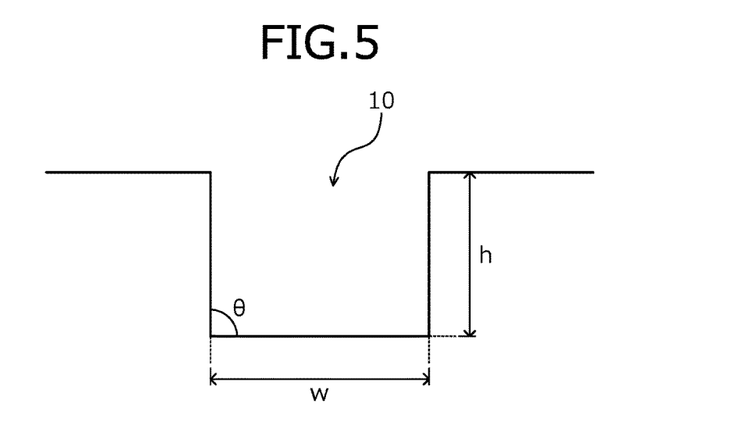
FIG. 5 is a cross-sectional view of a structure of an air pocket of the power semiconductor module according to the first embodiment.

A structure of the air pocket 10 will be described. FIG. 5 is a cross-sectional view of a structure of the air pocket of the power semiconductor module according to the first embodiment. The air pocket 10 is a groove provided in the front surface of the conductive plate 3. FIG. 5 is a cross-sectional view of the groove. The groove may have a height h that is 500 μm or greater, and a width that is 500 μm or greater.

Voids that cause peeling of the sealing resin 9 on the conductive plate 3 are voids having a diameter of 500 μm or greater and therefore, to trap these voids, the width w is 500 μm or greater. Further, to prevent the trapped voids from leaving the air pocket 10, the height h is 500 μm or greater. The air pocket 10 provided on the conductive plate 3 may penetrate the conductive plate 3 without passing through the conductive plate 3. Further, the air pocket 10 may penetrate and pass through the conductive plate 3, and reach the insulating substrate 2. Further, the air pocket 10 may penetrate the conductive plate 3 and be further formed in the insulating substrate 2. However, the air pocket 10 does not penetrate to a bottom of the stacked substrate.

Further, an angle θ formed by a side surface and a bottom of the air pocket 10 may be 90° or greater. In this case, a mathematical area of the opening is greater than a mathematical area of the bottom, facilitating entrance of the voids and trapping of the voids.

Figure 6:
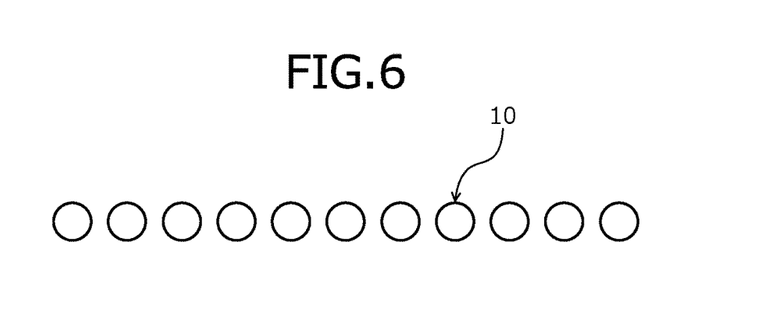
FIG. 6 is a top view of another structure of the air pocket of the power semiconductor module according to the first embodiment.

FIG. 6 is a top view of another structure of the air pocket of the power semiconductor module according to the first embodiment. As depicted in FIG. 6, the air pocket 10 may have a shape of a hole and not a groove. In this case as well, the hole may have a depth of 500 μm or greater, a diameter of 500 μm or greater, and the angle θ formed by a side surface and a bottom thereof may be 90° or greater. Further, formation of the air pocket 10 as a hole further enhances an anchoring effect of the sealing resin 9 to the conductive plate 3 at an air pocket that has not trapped voids, thereby enabling greater adhesion between the insulating substrate 2 and the sealing resin 9 than in the case of a groove. Here, while shapes of the air pocket 10 have been described as a groove and a hole, any shape that enables trapping of voids may be adopted.

In this manner, since the air pocket 10 may trap voids, in the semiconductor device according to the present embodiment of the invention, a sealing resin in which voids have a greater tendency to occur may be used as compared to in the conventional semiconductor device. The air pocket 10 traps voids, whereby even when voids occur, the reliability of the semiconductor device is not affected.

Figure 10:
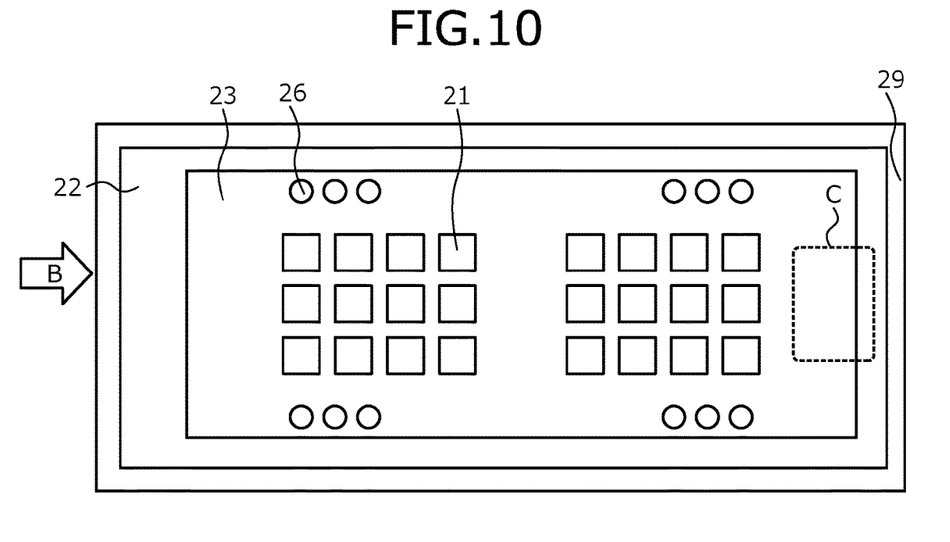
FIG. 10 is a top view of a configuration of a molded-type power semiconductor module.

Here, a case in which a power semiconductor module does not include an air pocket will be described as a comparison example. FIG. 10 is a top view of a configuration of the molded-type power semiconductor module. The sealing resin 29 is injected in the mold, for example, in a direction indicated by reference character B, from a transverse side of the insulating substrate 22 that has a rectangular shape. In this case, in the injected sealing resin 29, voids occur at a region where two or more flows of the sealing resin 29 merge in the cavity, such as a region C depicted in FIG. 10. Further, at the region where the sealing resin 29 merges such as the region C in FIG. 10, a linear mark called a well drain may be seen. The region C does not have an air pocket and therefore, these voids spread to a periphery at the surface of the stacked substrate 22, peeling of the sealing resin 29 occurs over a wide range at corners of the stacked substrate 22. Peeling further occurs at a periphery of the conductive plate 23 of the power semiconductor chip 21, whereby the power semiconductor chip 21 may have defective insulation and the reliability of the power semiconductor module may decrease.

In the semiconductor device according to the present embodiment of the invention, the sealing resin 9 that is used may have a low viscosity. In particular, the sealing resin 9 that is used may have a viscosity of 1000 Pascal seconds (Pa·sec) or less. When the viscosity is low, the sealing resin 9 is injected into the cavity of the mold with greater intensity and voids tend to occur. Therefore, in the conventional semiconductor device, the sealing resin 9 that has a low viscosity cannot be used. However, in the present invention, the air pocket 10 traps the voids and therefore, the sealing resin 9 that has a low viscosity may be used. The sealing resin 9 that has a low viscosity may be injected in the cavity of the mold in a shorter period of time, thereby enabling the time consumed for manufacturing the semiconductor device may be reduced.

Further, for example, in the method of manufacturing the semiconductor device according to the present embodiment of the invention, an injection rate of the sealing resin 9 injected in the cavity of the mold may be higher than that for the conventional semiconductor device. When the sealing resin 9 is injected at a faster rate, voids tend to occur and therefore, in a conventional method of manufacturing the conventional semiconductor device, the injection rate is at a rate at which voids are less likely to occur, or lower. However, in the present invention, the air pocket 10 traps the voids and therefore, the sealing resin 9 may be injected at a high rate. When injected at a high rate, the sealing resin 9 may be injected in the cavity of the mold in a shorter period of time, thereby enabling the time consumed for manufacturing the semiconductor device may be reduced.

The power semiconductor module of the first embodiment is manufactured as described below. In the method of manufacturing, first, a stacked substrate is prepared in which the conductive plate 3 is provided on the front surface of the insulating substrate 2 and the heat dissipating plate 4 is provided on the rear surface. Next, on the front surface of the conductive plate 3, in a region thereof where flows of the sealing resin 9 merge, the air pocket 10 is formed. For example, the conductive plate 3 is etched, whereby the air pocket 10 may be formed. Alternatively, a copper block may be soldered to the conductive plate 3, whereby the air pocket 10 may be formed, or the conductive plate 3 may be pressed, creating a groove, whereby the air pocket 10 may be formed.

Next, on the front surface of the conductive plate 3 provided on the stacked substrate, the power semiconductor chips 1 are mounted, and the power semiconductor chips 1 and the conductive plate 3 are electrically connected. Next, the power semiconductor chips 1 and the metal terminal 6 are electrically connected by a metal wire or the like. Thus, a power semiconductor circuit member formed with a switching circuit is assembled.

Next, in a mold for molding resin, a power semiconductor circuit member is set and the mold is filled with the sealing resin 9 containing a hard resin such as an epoxy. The molding of the sealing resin 9 may be transfer molding or injection molding. Thus, the power semiconductor module according the present embodiment and depicted in FIG. 1 is completed.

As described, according to the semiconductor device of the first embodiment, an air pocket for trapping voids is provided on the front surface of the conductive plate. The voids trapped in the air pocket are at a periphery of the conductive plate of the power semiconductor chip and do not cause peeling. Further, the trapped voids do not leave the air pocket 10 and therefore, do not move to a location where degradation of the electrical reliability of the power semiconductor module would be affected. As a result, the reliability of the power semiconductor module does not decrease due to insulation defects of the power semiconductor chips 1.

Figure 7:
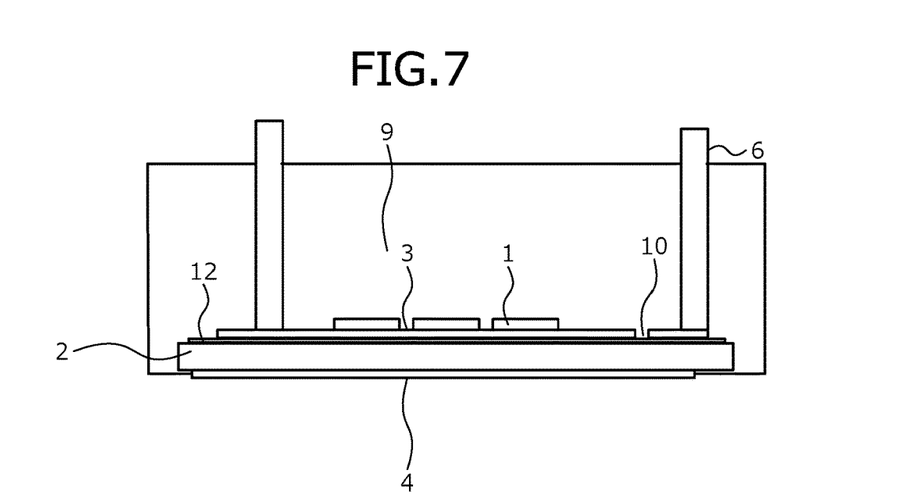
FIG. 7 is a cross-sectional view of a configuration of the power semiconductor module according to a second embodiment.

A structure of the semiconductor device according to a second embodiment will be described. FIG. 7 is a cross-sectional view of a configuration of the power semiconductor module according to the second embodiment. The power semiconductor module according to the second embodiment differs from the power semiconductor module according to the first embodiment in that a conductive thin film 12 is provided between the insulating substrate 2 and the conductive plate 3.

The conductive thin film 12, for example, is a thin film made of copper. The air pocket 10 is not provided on the conductive thin film 12. When the air pocket 10 is a groove or a hole, the groove or the hole is not provided on the conductive thin film 12. Provision of the conductive thin film 12 enables electrical connection of regions divided by the air pocket 10 and setting a potential of the regions divided by the air pocket 10 to be a same potential. Since the potentials are the same, discharge between the regions divided by the air pocket 10 may be prevented.

In a method of manufacturing such a power semiconductor module, first, the stacked substrate is prepared in which the conductive thin film 12 is provided on the front surface of the insulating substrate 2 and the heat dissipating plate 4 is provided on the rear surface. Next, on a front surface of the conductive thin film 12, a conductive plate is bonded. At this time, the air pocket 10 is formed in a region in which flows of the sealing resin 9 merge. For example, at the front surface of the conductive thin film 12, the conductive plate 3 may be bonded by soldering, brazing or the like, separated from the region in which flows of the sealing resin 9 merge and thus, the air pocket 10 may be formed. Further, the conductive plate 3 may be bonded by pressure bonding, adhesion, etc., thereby forming the air pocket 10. In addition, the conductive plate 3 may be etched in advance, thereby forming the air pocket 10, and the conductive plate 3 may be bonded having the air pocket 10 disposed in a region in which flows of the sealing resin 9 merge. The conductive plate 3 may be pressed, creating a groove and thereby, forming the air pocket 10. Thus, the air pocket 10 is formed on the front surface of the conductive plate 3, in a region where flows of the sealing resin 9 merge. Next, similarly to the first embodiment, the power semiconductor chips 1 are mounted, and the power semiconductor chips 1 and the conductive plate 3 provided on the stacked substrate are electrically connected. Thereafter, similarly to the first embodiment, the power semiconductor module according to the second embodiment and depicted in FIG. 7 is completed.

As described, the semiconductor device according to the second embodiment achieves effects similar to those of the semiconductor device according to the first embodiment. The semiconductor device according to the second embodiment further includes a conductive thin film provided between the insulating substrate and the conductive plate. As a result, regions divided by the air pocket may be electrically connected and have a same potential. Therefore, discharge between regions divided by the air pocket may be prevented.

Figure 8:
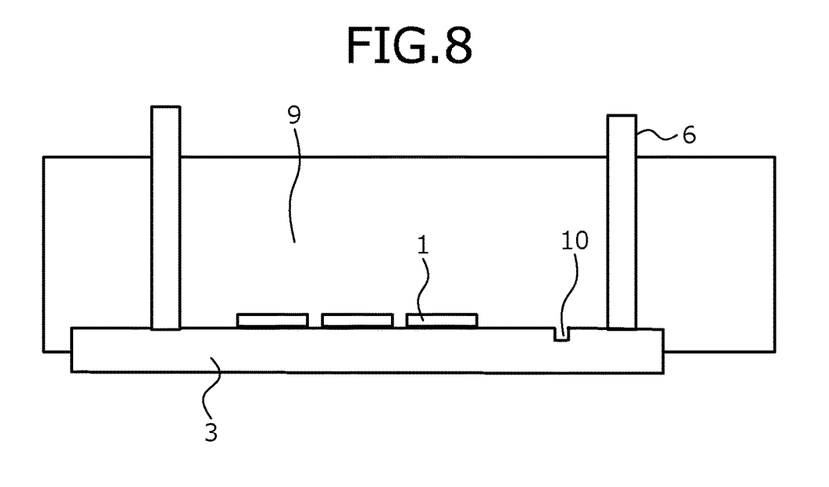
FIG. 8 is a cross-sectional view of another configuration of the power semiconductor module according to the first embodiment.

In the first embodiment, while a configuration has been described in which the power semiconductor chips 1 are mounted on the stacked substrate constituted by the insulating substrate 2 and the conductive plate 3, the configuration may omit the stacked substrate. FIG. 8 is a cross-sectional view of another configuration of the power semiconductor module according to the first embodiment. As depicted in FIG. 8, the configuration may be such that the power semiconductor chips 1 are mounted on the front surface of the conductive plate 3 and the insulating substrate 2 is not provided. In this case, the air pocket 10 is provided on the front surface of the conductive plate 3. Even with such a configuration, the position, the shape, the size, etc. of the air pocket 10 is similar to those in the first embodiment. Further, in this case, the air pocket 10 does not penetrate to a lower surface of the conductive plate 3.

With such a configuration, similarly to the second embodiment, regions divided by the air pocket 10 may be electrically connected and have a same potential. Therefore, discharge between regions divided by the air pocket 10 may be prevented. Further, the air pocket 10 does not penetrated to the lower surface of the conductive plate 3, whereby voids are not exposed at the surface of the semiconductor device and defects in appearance may be prevented.

The present invention is not limited to the embodiments above and various modifications within a range not departing from the spirit of the present invention are possible. For example, while an example has been described in which in a package of the semiconductor device, a metal wire electrically connects semiconductor chips and a metal terminal, and a thermosetting resin fills a case, the present invention is further applicable to a package of a semiconductor device having a lead frame structure in which semiconductor chips disposed separated from each other in a case are electrically connected and semiconductor layers of a circuit board are electrically connected, by a lead frame; or a post structure in which electrical connection is by a post electrode and a printed circuit board.

As described, an air pocket for trapping bubbles (voids) is provided on the conductive plate. The voids trapped in the air pocket are at the periphery of the conductive plate of the power semiconductor chip and do not cause peeling. Further, the trapped voids do not leave the air pocket and therefore, do not move to a location where degradation of the electrical reliability of the power semiconductor module would be affected. As a result, the reliability of the power semiconductor module does not decrease due to insulation defects of the power semiconductor chips 1.

The semiconductor device and the method of manufacturing a semiconductor device according to the embodiments of the present invention achieve an effect in that insulation defects due to peeling of the sealing resin on the conductive plate is prevented, enabling reliability to be increased.

Thus, the semiconductor device and the method of manufacturing a semiconductor device according to the embodiments of the present invention are useful for power semiconductor devices used in power converting equipment such as inverters, in power control units of vehicles, power supply devices such as in various industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a conductive plate having a front surface and a semiconductor element mounted on the front surface; and
a sealing resin sealing therein at least the front surface of the conductive plate,
wherein
the sealing resin is injected from at least one inlet on a first side of the conductive plate,
a structure that traps bubbles is provided on the front surface of the conductive plate, in a region where flows of the sealing resin merge, the region being provided in a corner of a second side that opposes the first side from which the sealing resin is injected, or the region being provided at a center of the second side that opposes the first side from which the sealing resin is injected.

2. The semiconductor device according to claim 1, wherein
the conductive plate has a rectangular shape,
the sealing resin is injected from a single inlet on the first side of the conductive plate, the first side being a longitudinal side of the conductive plate, and
the region is provided in the corner of the second side that is across the semiconductor element, and opposes the first side from which the sealing resin is injected.

3. The semiconductor device according to claim 1, wherein
the conductive plate has a rectangular shape,
the sealing resin is injected from a plurality of inlets on the first side of the conductive plate, the first side being a longitudinal side of the conductive plate, and the region is provided at the center of the second side that opposes the first side from which the sealing resin is injected.

4. The semiconductor device according to claim 1, wherein
the conductive plate has a rectangular shape,
the sealing resin is injected from the at least one inlet on the first side of the conductive plate, the first side being a transverse side of the conductive plate, and
the region is provided at the center of the second side that opposes the first side from which the sealing resin is injected.

5. The semiconductor device according to claim 1, wherein
the structure that traps bubbles is provided orthogonal to a direction of a vector of the flows of the sealing resin.

6. The semiconductor device according to claim 1, wherein
the structure that traps the bubbles has a shape of a groove or a hole.

7. The semiconductor device according to claim 1, further comprising
a stacked substrate having the conductive plate on which the semiconductor element is mounted on the front surface, an insulating substrate, and a heat dissipating plate, wherein
the sealing resin seals therein the semiconductor element, the conductive plate, and the insulating substrate, and exposes a rear surface of the heat dissipating plate.

8. A semiconductor device, comprising:
a stacked substrate including:
 a conductive plate having a front surface and a semiconductor element mounted on the front surface,
 an insulating substrate,
 a heat dissipating plate, and
 a thin conductive plate between the conductive plate and the insulating substrate;
a sealing resin sealing therein the semiconductor element, the conductive plate, and the insulating substrate, and exposes a rear surface of the heat dissipating plate,
wherein
a structure that traps bubbles is provided on the front surface of the conductive plate, in a region where flows of the sealing resin merge, and the thin conductive plate is free of the structure that traps the bubbles.

9. A method of manufacturing a semiconductor device, the method comprising:
forming on a front surface of a conductive plate having a first side and a second side, in a region where flows of a sealing resin merge, a structure that traps bubbles, the region being provided in a corner of the second side that is across the semiconductor element and opposes the first side or the region being provided at a center of the second side that opposes the first side;
mounting a semiconductor element on the front surface of the conductive plate; and
injecting the sealing resin and sealing therein the semiconductor element and the front surface of the conductive plate, the sealing resin being injected from at least one inlet on the first side of the conductive plate.

10. The method according to claim 9, wherein
the region is provided in the corner of the second side, and
the sealing resin is injected from a single inlet on the first side of the conductive plate.

11. The method according to claim 10, wherein
the conductive plate has a rectangular shape, and
the first side and second side are longitudinal sides of the conductive plate.

12. The method according to claim 9, wherein
the region is provided at the center of the second side, and
the sealing resin is injected from a plurality of inlets on the first side of the conductive plate.

13. The method according to claim 12, wherein
the conductive plate has a rectangular shape, and
the first side and second side are longitudinal sides of the conductive plate.

14. The method according to claim 9, wherein
the region is provided at the center of the second side, and
the sealing resin is injected from the at least one inlet on the first side of the conductive plate.

15. The method according to claim 14, wherein
the conductive plate has a rectangular shape, and
the first side and second side are transverse sides of the conductive plate.

16. The method according to claim 9, wherein
the structure that traps bubbles is provided orthogonal to a direction of a vector of the flows of the sealing resin.

17. The method according to claim 9, wherein
the structure that traps the bubbles has a shape of a groove or a hole.

* * * * *